US009229810B2

(12) United States Patent
He et al.

(10) Patent No.: US 9,229,810 B2
(45) Date of Patent: Jan. 5, 2016

(54) ENABLING EFFICIENT RECOVERY FROM MULTIPLE FAILURES TOGETHER WITH ONE LATENT ERROR IN A STORAGE ARRAY

(71) Applicant: International Business Machines Corporation, Armonk, NY (US)

(72) Inventors: Huan He, Beijing (CN); Mingqiang Li, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 13/919,295

(22) Filed: Jun. 17, 2013

(65) Prior Publication Data

US 2014/0040702 A1     Feb. 6, 2014

(30) Foreign Application Priority Data

Jul. 31, 2012    (CN) .......................... 2012 1 0270002

(51) Int. Cl.
| | |
|---|---|
| G06F 11/10 | (2006.01) |
| H03M 13/29 | (2006.01) |
| H03M 13/11 | (2006.01) |
| H03M 13/27 | (2006.01) |
| H03M 13/37 | (2006.01) |
| H03M 13/15 | (2006.01) |

(52) U.S. Cl.
CPC .......... *G06F 11/1076* (2013.01); *H03M 13/27* (2013.01); *H03M 13/293* (2013.01); *H03M 13/2942* (2013.01); *H03M 13/373* (2013.01); *H03M 13/1102* (2013.01); *H03M 13/1515* (2013.01)

(58) Field of Classification Search
None
See application file for complete search history.

(56) References Cited

U.S. PATENT DOCUMENTS

| | | | |
|---|---|---|---|
| 6,473,880 B1 | 10/2002 | Cypher | |
| 7,904,782 B2 * | 3/2011 | Huang et al. | .................. 714/752 |
| 8,006,126 B2 | 8/2011 | Deenadhayalan et al. | |

(Continued)

FOREIGN PATENT DOCUMENTS

CN          103577274 A      2/2014

OTHER PUBLICATIONS

Pinheiro et al., "Failure Trends in a Large Disk Drive Population", Appears in the Proceedings of the 5th USENIX Conference on File and Storage Technologies (FAST'07), Feb. 2007, pp. 1-13.
Bairavasundaram et al., "An Analysis of Latent Sector Errors in Disk Drives", SIGMETRICS'07, Jun. 12-16, 2007, San Diego, California, pp. 289-300.

(Continued)

*Primary Examiner* — Justin R Knapp
(74) *Attorney, Agent, or Firm* — L. Jeffrey Kelly; Vazken A. Alexanian

(57) ABSTRACT

The present invention provides a method and apparatus of managing a storage array. The method comprises: striping the storage array to form a plurality of stripes; selecting F storage chunks from each stripe as local parity chunks, and selecting another L storage chunks from the storage array as global parity chunks; performing (F+L) fault tolerant erasure coding on all data chunks in a stripe to generate (F+L) groups of parity data, and storing F groups of parity data therein into the F local parity chunks; performing cross-stripe operation on another L groups of parity data to generate L groups of global parity data, and storing them into the L global parity chunks, respectively. The apparatus corresponds to the method. With the invention, a plurality of errors in the storage array can be detected and/or recovered to improve fault tolerance and space utilization of the storage array.

20 Claims, 11 Drawing Sheets

(56) References Cited

U.S. PATENT DOCUMENTS

| | | | |
|---|---|---|---|
| 8,041,990 | B2 | 10/2011 | O'Connor et al. |
| 8,171,379 | B2 * | 5/2012 | Adarshappanavar et al. 714/770 |
| 2006/0242542 | A1 * | 10/2006 | English et al. ............... 714/770 |
| 2007/0089045 | A1 * | 4/2007 | Corbett et al. ............... 714/801 |
| 2012/0221533 | A1 * | 8/2012 | Burness et al. ............... 707/690 |

OTHER PUBLICATIONS

Blaum et al., "Partial-MDS Codes and Their Application to RAID Type of Architectures", IBM Research Report, RJ10498 (ALM1202-001) Feb. 2, 2012, Computer Science, 36 pages.

* cited by examiner

| D0 | D1 | D2 | D3 | D4 | P1 | P2 |
|----|----|----|----|----|----|----|
|    |    |    |    |    | CK0 | CK0 |
|    |    |    |    |    | CK1 | CK1 |
|    |    |    |    |    | CK2 | CK2 |
|    |    |    |    |    | CK3 | CK3 |
|    |    |    |    |    | CK4 | CK4 |
|    |    |    |    |    | CK-P1 | CK-P2 |

FIG. 10

ENABLING EFFICIENT RECOVERY FROM MULTIPLE FAILURES TOGETHER WITH ONE LATENT ERROR IN A STORAGE ARRAY

The present application claims the benefit of priority of Chinese Patent Application Serial Number 201210270002.3, filed Jul. 31, 2012 with the State Intellectual Property Office (SIPO) of the People's Republic of China, the contents of which are herein incorporated by reference in its entirety.

BACKGROUND

The present invention relates to a storage device, and more specifically, to a method and apparatus of managing and controlling a storage array consisting of storage devices.

With the rapid development of information technology, there is an increasingly huge amount of data to be stored and processed. To this end, the storage density and storage capacity of a single storage device is increased, and at the same time, a storage array consisting of a plurality of storage devices is generally used to store data. Typically, a storage array consists of a plurality of independent non-volatile storage devices, for example, devices such as disks, SSDs, etc; these storage devices are connected collectively to a storage array controller, and perform data storage-related operations under the control of the controller.

In addition to controlling the read and write operations of data in the array, the storage array controller further controls the storage device to detect and recover a variety of errors that may occur in the read and write operations. As known to those skilled in the art, there are three kinds of device errors in a storage array: device failure, latent error, and silent error.

Device failure refers to a case where the entire storage device fails and therefore cannot perform read and write operations. Latent error refers to a case where part of data chunks in the storage device (e.g., a certain sector in the disk) fail and thus it is impossible to perform read and write operations on the failed data chunks. Because the data read and write operations cannot be performed with respect to the failed device or failed data chunks, device failure and latent error can be detected by the storage device itself.

In order to be able to recover device failures and latent errors, there is proposed RAID (Redundant Arrays of Inexpensive Disks) technology. RAID5 with 1 fault tolerance, which is most widely used in this technology, distributes data to different storage devices by striping process in order to improve parallelism of data access, and employs one parity data chunk in each stripe so that the disk array can tolerate one disk failure or tolerate the presence of one latent sector error in one stripe. However, when one disk failure and one latent sector error appear simultaneously, RAID5 cannot repair a stripe containing two failed data chunks. With respect to this problem, RAID6 with 2 fault tolerance has been proposed and gradually applied. The RAID6 can tolerate one device failure and one latent error simultaneously. However, the existing RAID has the following deficiencies: firstly, the fault tolerant capability is still not ideal, and secondly, the storage efficiency is not high enough, leading to certain storage space wastage.

Another kind of device errors is silent errors. Silent errors are errors that cannot be detected by the storage device itself, and usually caused by unsuccessful data writes. There are several following typical reasons for silent errors: one is when data is written, a head positioning error leads to the writing of the data into a wrong storage position; one is that data writing process is not completed and the data fails to be written completely; and a further one is that a data write operation has not been truly performed and the target storage position still retains old data. In the above circumstances, the first two will cause data corrupted, and the last one will cause data stale. For the case of the silent error, the storage device itself cannot detect and report errors; and if it performs data read as usual in the case of the presence of a silent error, it will read wrong data. Therefore, for silent errors, it is necessary to additionally provide a certain mechanism to detect such errors, and then to repair the wrong data.

For silent errors, several solutions have been proposed for detecting them in the prior art. One is to improve encoding and decoding methods for data so as to implement the detection of silent errors through better coding mechanism. However, in such methods, the process for positioning a silent error is quite complicated, and the efficiency is not high. Another solution is to append and store check values for data. However, when silent errors occur in a storage area for storing the check values, such solution cannot work.

Therefore, to sum up, it is desired to propose an improved mechanism for managing the storage array so that the storage array can be able to detect and recover at least one device error.

SUMMARY

In view of the issues raised hereinabove, there is proposed the invention which is intended to provide a solution capable of better managing a storage array to improve its error detection and recovering capability.

According to one embodiment of the present invention, there is provided a method of managing a storage array consisting of n storage devices, the method comprising: striping the storage array to form m stripes, wherein each stripe contains n storage chunks, the n storage chunks being from the n storage devices, respectively; selecting F storage chunks from each stripe as local parity chunks, selecting another L storage chunks from the storage array as global parity chunks, and using at least a part of storage chunks in the storage array except the local parity chunks and global parity chunks as data chunks; performing (F+L) fault tolerant erasure coding on data in all data chunks in a stripe to generate (F+L) groups of parity data, and storing F groups of parity data in F local parity chunks of this stripe, respectively; performing cross-stripe operation on L groups of parity data of the (F+L) groups of parity data to generate L groups of global parity data, and storing the L groups of global parity data in the L global parity chunks, respectively.

According to another embodiment of the present invention, there is provided an apparatus of managing a storage array consisting of n storage devices, the apparatus comprising: a striping unit configured to stripe the storage array to form m stripes, wherein each stripe contains n storage chunks, the n storage chunks being from the n storage devices, respectively; a selection unit configured to select F storage chunks from each stripe as local parity chunks, select another L storage chunks from the storage array as global parity chunks, and use at least a part of storage chunks in the storage array except the local parity chunks and global parity chunks as data chunks; a local parity storage unit configured to perform (F+L) fault tolerant erasure coding on data in all data chunks in a stripe to generate (F+L) groups of parity data, and store F groups of parity data in the F local parity chunks in this stripe, respectively; and a global parity storage unit configured to perform cross-stripe operation on L groups of parity data of the (F+L) groups of parity data to generate L groups of global parity data, and store the L groups of global parity data in the L global parity chunks, respectively.

With the method and apparatus of embodiments of the present invention, at least one kind of error in the storage array can be detected and/or recovered to improve the fault tolerance and space utilization of the storage array.

BRIEF DESCRIPTION OF THE DRAWINGS

Through the more detailed description of exemplary embodiments of the present disclosure in conjunction with the accompanying drawings, the above and other objects, features and advantages of the present disclosure will become more apparent, wherein the same reference generally refers to the same components in the exemplary embodiments of the present disclosure.

FIG. 10 shows a schematic diagram of appended checksums according to one embodiment;

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
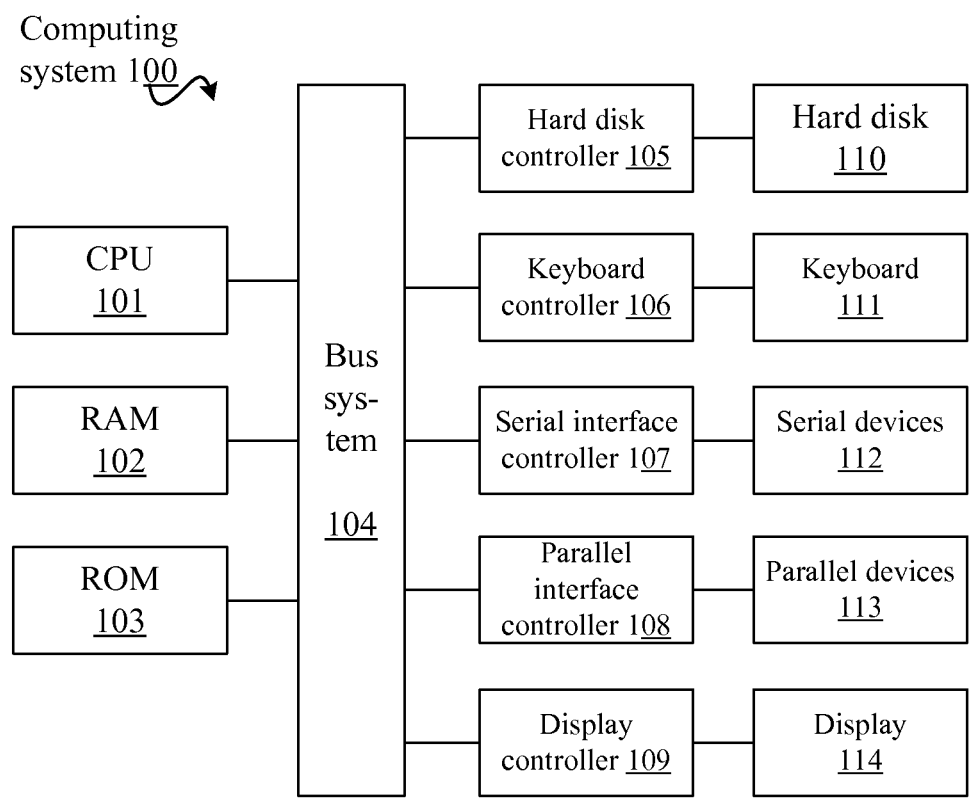
FIG. 1 shows a block diagram of an exemplary computer system 100 which is applicable to implement embodiments of the present invention.

FIG. 1 shows an exemplary computer system 100 which is applicable to implement the embodiments of the present invention. As shown in FIG. 1, the computer system 100 may include: CPU (Central Process Unit) 101, RAM (Random Access Memory) 102, ROM (Read Only Memory) 103, System Bus 104, Hard Drive Controller 105, Keyboard Controller 106, Serial Interface Controller 107, Parallel Interface Controller 108, Display Controller 109, Hard Drive 110, Keyboard 111, Serial Peripheral Equipment 112, Parallel Peripheral Equipment 113 and Display 114. Among above devices, CPU 101, RAM 102, ROM 103, Hard Drive Controller 105, Keyboard Controller 106, Serial Interface Controller 107, Parallel Interface Controller 108 and Display Controller 109 are coupled to the System Bus 104. Hard Drive 110 is coupled to Hard Drive Controller 105. Keyboard 111 is coupled to Keyboard Controller 106. Serial Peripheral Equipment 112 is coupled to Serial Interface Controller 107. Parallel Peripheral Equipment 113 is coupled to Parallel Interface Controller 108. And, Display 114 is coupled to Display Controller 109. It should be understood that the structure as shown in FIG. 1 is only for the exemplary purpose rather than any limitation to the present invention. In some cases, some devices may be appended to or removed from the computer system 100 based on specific situations.

As will be appreciated by one skilled in the art, aspects of the present invention may be embodied as a system, method or computer program product. Accordingly, aspects of the present invention may take the form of an entirely hardware embodiment, an entirely software embodiment (comprising firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, comprising, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, comprising but not limited to wireless, wireline, optical fiber cable, RF, etc., or any suitable combination of the foregoing.

Computer program code for carrying out operations for aspects of the present invention may be written in any combination of one or more programming languages, comprising an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, comprising a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each chunk of the flowchart illustrations and/or block diagrams, and combinations of chunks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram chunk or chunks.

These computer program instructions may also be stored in a computer readable medium that can direct a computer, other programmable data processing apparatus, or other devices to function in a particular manner, such that the instructions stored in the computer readable medium produce an article of manufacture comprising instructions which implement the function/act specified in the flowchart and/or block diagram chunk or chunks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram chunk or chunks.

Embodiments of the present invention will be described below in conjunction with the accompanying drawings.

Figure 2:
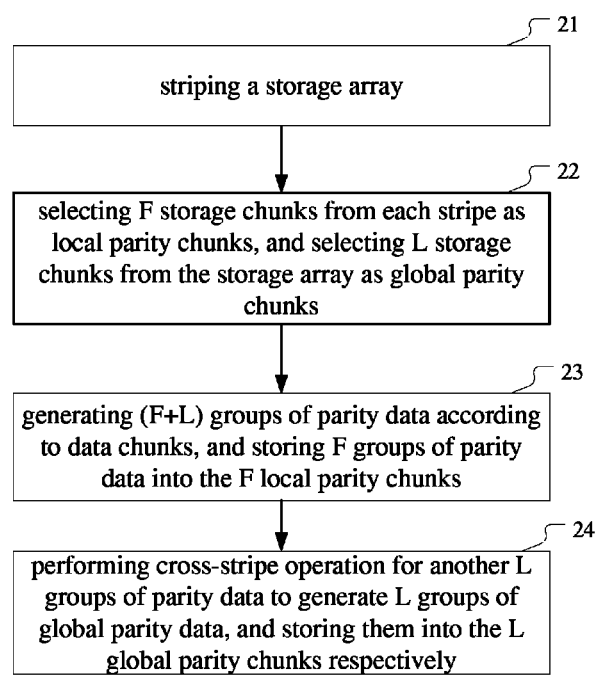
FIG. 2 shows a flowchart of a method of managing a storage array according to an embodiment of the present invention.

Reference is made now to FIG. 2, which describes a method of managing a storage array according to an embodiment of the present invention. As shown in the flowchart of FIG. 2, the method of managing a storage array consisting of n storage devices comprises: step 21 of striping the storage array; step 22 of selecting F storage chunks from each stripe as local parity chunks, and selecting L storage chunks from the storage array as global parity chunks; step 23 of generating (F+L) groups of parity data for each stripe according to data in data chunks, and storing F groups of parity data in the F local parity chunks; step 24 of performing cross-stripe operation on L groups of parity data of the (F+L) groups of parity data generated for each stripe, to generate L groups of global parity data, and storing the L groups of global parity data in the L global parity chunks, respectively. The execution of the steps of FIG. 2 is described below in conjunction with specific examples.

Figure 3A:
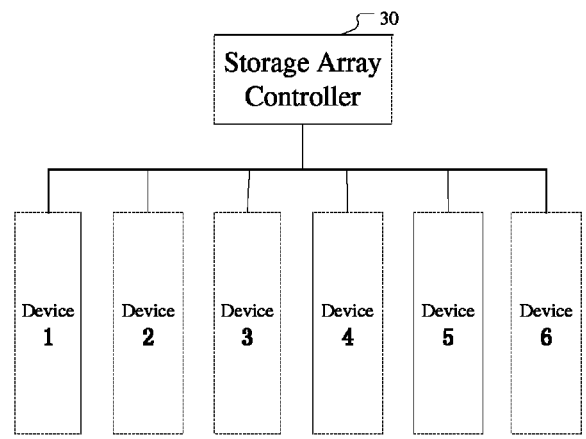
FIG. 3A schematically shows a storage array.
Figure 3B:
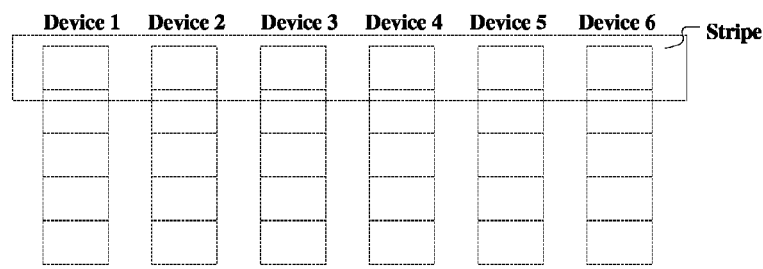
FIG. 3B schematically shows a striped storage array.

FIG. 3A schematically shows a storage array. As shown, the storage array comprises n storage devices (in the example of FIG. 3A, n=6), marked as Device 1, Device 2, . . . Device n, respectively. Said n storage devices are connected collectively to a storage array controller 30. For such a storage array, step 21 is executed first, that is, the storage array is striped to form m stripes, such that each stripe contains n storage chunks from the n storage devices, respectively. In other words, each storage device can be considered as one column and the striping in step 21 means that the storage devices are further divided transversely into m rows, each row corresponding to one stripe. FIG. 3B schematically illustrates a striped storage array. From the illustration of FIG. 3B, it can be seen that by striping, each storage device is divided into m storage chunks. n storage chunks in the same row constitute one stripe. That is, the n storage devices can be seen as one matrix of n*m with chunks as elements thereof. In the example of FIG. 3B, m=5. However, the number of m can be set according to the size of the storage device, the size of the required storage chunk, etc. A similar striping way is adopted in the existing RAID technology. Therefore, no detailed description of specific steps of executing striping will be given.

Next, in step 22, F storage chunks are selected from each stripe as local parity chunks, L storage chunks are selected additionally from the storage array as global parity chunks, and at least part of storage chunks in the storage array except the local parity chunks and global parity chunks is used as data chunks.

The selection of local parity chunks is described firstly. Since each stripe contains n storage chunks, thus apparently, F<n. In fact, F is equal to the number of device failures that can be tolerated by the storage array. This will be further described later in conjunction with fault tolerant coding. Besides the local parity chunks, L storage chunks are selected additionally from the storage array as global parity chunks. That is, a global parity chunk and a local parity chunk would not reside in a same storage chunk. According to the fault tolerant mechanism of the fault tolerant erasure coding, the number L of global parity chunks is equal to the number of latent errors that can be tolerated by the storage array.

Figure 4A:
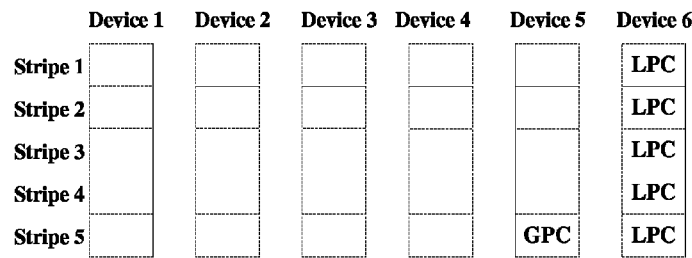
FIGS. 4A-4C show schematic diagrams of storage arrays according to embodiments of the present invention.

FIG. 4A illustrates a schematic diagram of a storage array according to one embodiment. Specifically, FIG. 4A shows a schematic diagram of the selection of parity chunks from the striped storage array of FIG. 3B. In the example of FIG. 4A, F=L=1, thus F=1 local parity chunk (marked as LPC) in each stripe is selected. In addition, in the last stripe, L=1 storage chunk is further selected additionally as a global parity chunk (marked as GPC). It is understood that for exemplary purpose, FIG. 4A shows a specific parity chunk selecting manner, but this is not the only way to select the parity chunks. For example, although in FIG. 4A, m local parity chunks of different stripes are located in the storage device n (or, in the same column), but in other examples, local parity chunks of different stripes may be located in different storage devices. For example, it can be appreciated that in the second stripe, storage chunks in the storage device n−1 may be selected as local parity chunks. Similarly, although in FIG. 4A the global parity chunk is located in the last stripe, but in other examples, any one storage chunk in the storage array may be selected as a global parity chunk, as long as the local parity chunks and the global parity chunk are not located at a same storage chunk. In addition, the selection of the local parity chunks and global parity chunk may be performed in any order. In one embodiment, the local parity chunks may be selected at first, and then the global parity chunk; while in another embodiment, the global parity chunk may be selected at first; or, the local parity chunks and the global parity chunk may be selected at the same time.

Figure 4B:
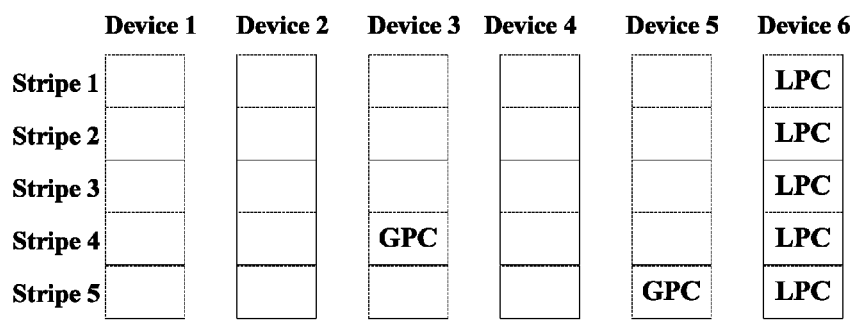

FIG. 4B illustrates a schematic diagram of a storage array according to another embodiment. In the example of FIG. 4B, F=1, and L=2. Therefore, similar to FIG. 4A, one local parity chunk LPC in each stripe is selected. In addition, in the stripe m and the stripe m−1, one storage chunk is selected for each as a global parity chunk GPC. Although in the example of FIG. 4B, a plurality of global parity chunks are located in different stripes, this is not necessary. In other examples, all of or some of the plurality of global parity chunks may be located in the same stripe.

Figure 4C:
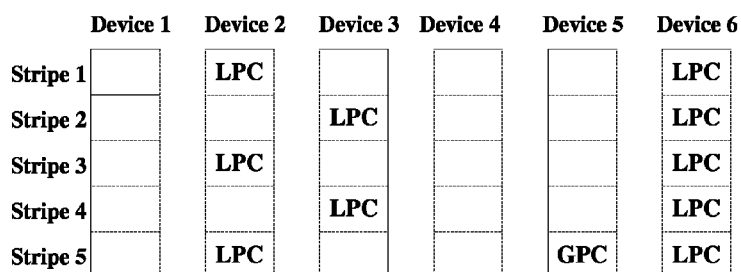

FIG. 4C illustrates a schematic diagram of a storage array according to another embodiment. In the example of FIG. 4C, F=2, and L=1. Therefore, two local parity chunks in each stripe are selected, so that the entire storage array has a total of 2*m=10 local parity chunks. The 10 local parity chunks are distributed in three storage devices, wherein all storage chunks in the storage device n are selected as local parity chunks, and the storage device 2 and the storage device 3 collectively carry other local parity chunks. In addition, similar to FIG. 4A, in the last stripe one storage chunk is further selected additionally as a global parity chunk.

In one embodiment, in order to quickly select the local parity chunks, F storage devices may be selected from n storage devices as parity storages, and all storage chunks in these F parity storages may act as local parity chunks. So, there must be F local parity chunks in each stripe.

Examples of parity chunk selection in the cases of different F, L values are described above. As mentioned before, these examples are merely illustrative, and those skilled in the art may modify the above embodiments to obtain more selection manners. And, based on the above typical embodiments, in the case of other F and L values, those skilled in the art can select the local parity chunks and global parity chunks correspondingly within the scope of the inventive concept.

In one embodiment, both the above step 21 of striping and step 22 of selecting parity chunks are executed by the storage array controller during the initialization of the storage array. Once the local parity chunks and the global parity chunks are selected, the controller may record the selection results in the forms of tables, indexes, and the like for the control and management in the subsequent data read and write stage.

In one embodiment, where the parity chunks are selected or set, the controller uses the set parity chunks to store parity data generated by the fault tolerant coding on the data in the data read and write stage, so as to provide a basis for recovering of erroneous data.

Specifically, in step 23, for each stripe, (F+L) fault tolerant erasure coding is performed on data in all data chunks in this strip, to generate (F+L) groups of parity data, and any F groups of parity data therein are stored in F local parity chunks in this stripe, respectively. Next, in step 24, as to the other L groups of parity data generated for each stripe, cross-stripe operation is performed to generate L groups of global parity data, and these L groups of global parity data are stored in the L global parity chunks, respectively.

The above steps relate to a process of generating parity data through erasure coding and performing operation and storage for the generated parity data. Erasure code is a coding technology originating from channel transmission, and is introduced into the field of distributed storage because of its capability of tolerating the loss of a plurality of data frames, so to address the problem of data chunk failure. Currently, the erasure code based fault tolerant technology has become the most common fault tolerant coding technology that can tolerate the simultaneous failure of a plurality of data frames. Many studies have proposed many specific erasure coding methods in terms of improving fault tolerance and reducing coding complexity and the like. Depending on the difference in coding manner, these methods may be divided into types of Reed-Solomon code (referred to as RS code), parity array code, parity-check code and low-density parity-check code (referred to LDPC code) and the like.

Generally, when erasure code is used for fault tolerance, data objects to be stored are split firstly into a number of data chunks, and then these data chunks are encoded into encoded data chunks. As long as a sufficient quantity of encoded data chunks is obtained during the reading of data, they can be decoded to obtain original data. If k is used to represent the number of data chunks before encoding, b represents the number of bits included in each data chunk, k' represents an integer no less than k, n is the number of encoded data chunks, then a quadruple (n, k, b, k') may be used to define the erasure code. This definition represents that after encoding with the use of the erasure code, original data chunks may be decoded and restored by obtaining any k' encoded data chunks. This definition may be simplified as (n, k), wherein n represents the total number of data chunks and redundancy chunks, and k represents the minimum number of data chunks to be acquired. That is, after original k data chunks are encoded into n data chunks, the original k data chunks may be reconstructed through any k encoded data chunks.

Different erasure codes have different fault tolerance. For erasure codes that can tolerate errors of N data chunks, at least N redundant parity data chunks are generated on the basis of the original data chunks. Therefore, for a storage array configured by the steps 21 and 22, in order to enable the storage array to simultaneously tolerate F device failures and L latent errors, it is required to use failure-tolerant erasure coding that can tolerate failure of (F+L) data chunks. Accordingly, after such erasure coding, at least (F+L) redundant data chunks will be generated, each redundant data chunk consisting of a group of parity data.

Specifically, in conjunction with examples of FIG. 3 and FIG. 4, it can be seen, in order to perform erasure coding, the storage array has been divided into storage chunks through striping; and after F local parity chunks and L global parity chunks are selected, other storage chunks in the storage array may be used as data chunks. In order to be able to recover or reconstruct data in the data chunks when an error occurs to the data, in step 23, erasure coding that can tolerate (F+L) errors, namely, (F+L) fault tolerant erasure coding, is performed on data in all data chunks in each stripe. As described above, this will generate (F+L) groups of redundant parity data. Since F local parity chunks have been already selected for each stripe, F groups of parity data in the generated (F+L) groups of redundant parity data may be stored in the selected F local parity chunks, respectively. The F groups of parity data stored in the local parity chunks may be any F groups of the encoding-generated (F+L) groups of parity data.

It will be appreciated, if all the (F+L) groups of parity data are stored, erroneous data chunks can be recovered directly based on the redundancy parity data and uncorrupted data chunk. However, such a scheme requires a lot of space from the storage array to store redundancy parity data, thereby reducing the effective data storage capacity of the storage. Thus, in order to improve the space utilization of the storage array, in the embodiments of the present invention, for each stripe, only a part of encoding-generated (F+L) groups of redundancy parity data, namely, F groups of parity data, are stored by using the local parity chunks. For additional L groups of parity data, in step 24, cross-stripe operation is performed thereon, and the operation result is stored in the global parity chunks. That is, for the other L groups of parity data generated for each stripe, they are computed as intermediate results, thereby generating L groups of global parity data. The L global parity chunks selected in step 22 are used to store the generated L groups of global parity data.

Figure 5:
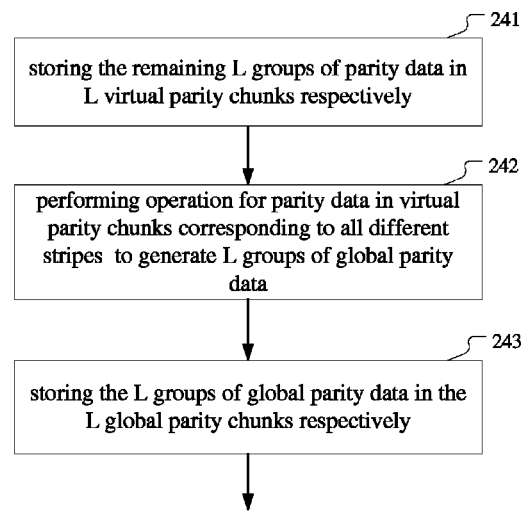
FIG. 5 shows steps of storing global parity data according to one embodiment.

FIG. 5 shows steps of storing global parity data according to one embodiment, that is, sub-steps of step 24 of FIG. 2. As shown in FIG. 5, first, in step 241, for each stripe, the L groups of parity data in the encoding-generated (F+L) groups of parity data that are not stored in the local parity chunks are respectively stored in L virtual parity chunks. The "virtual parity chunk" described above is merely an expression of the storage section for temporarily storing the L groups of parity data for the purpose of simple description. In an actual example, the virtual parity chunks may be a part of the storage array, or may be located in the storage array controller, or in other storage media connected with the storage array controller. In one example, in order for more clear description, it can be appreciated that L virtual parity storages are provided additionally and are likewise striped, and storage chunks in each virtual parity storage act as the above-described virtual parity chunks. So, similar to the F local parity chunks, each stripe further "has" correspondingly L virtual parity chunks. The F local parity chunks and L virtual parity chunks store collectively (F+L) groups of redundancy parity data generated by erasure coding.

Next, in step 242, operation is performed on the parity data in virtual parity chunks corresponding to all the different stripes, so as to generate the L groups of global parity data. In the case of introducing the expression of virtual parity storage, this step is to perform operation on the parity data in all virtual parity chunks in each of the L virtual parity storages, thereby generating the L groups of global parity data.

The above operation may adopt a plurality of computing methods. In one embodiment, XOR operation is performed on parity data in virtual parity chunks of different stripes, thereby generating the global parity data. In another embodiment, the operation may be summation performed on parity data in virtual parity chunks in different stripes. In another embodiment, the above operation may also be other linear operation performed on parity data of different stripes. In another embodiment, the operation may be a combination of several operations listed above. In addition, those skilled in the art may also use other operation manners, as long as parity data groups involved in operation can be obtained easily through reverse deduction from the operation results.

In step 243, the L groups of global parity data obtained through cross-stripe operation are respectively stored in the L global parity chunks selected in step 22. Thus, the storage amount of L parity chunks per stripe are "compressed" as a total of L (global) parity chunks required, thus better utilizing the storage space of the storage array.

Figure 6A:
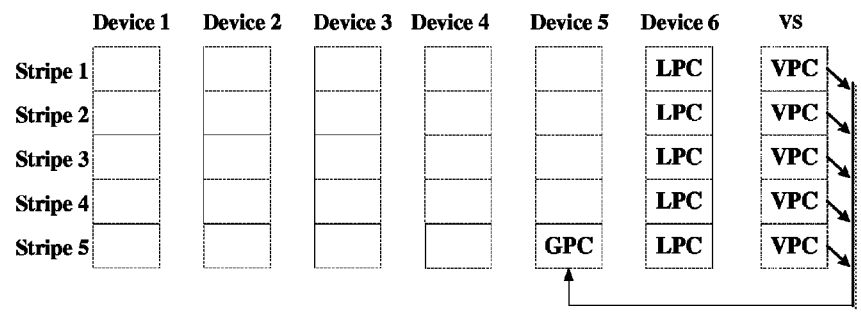
FIGS. 6A and 6B show schematic diagrams of storage arrays corresponding to FIGS. 4A and 4B respectively.
Figure 6B:
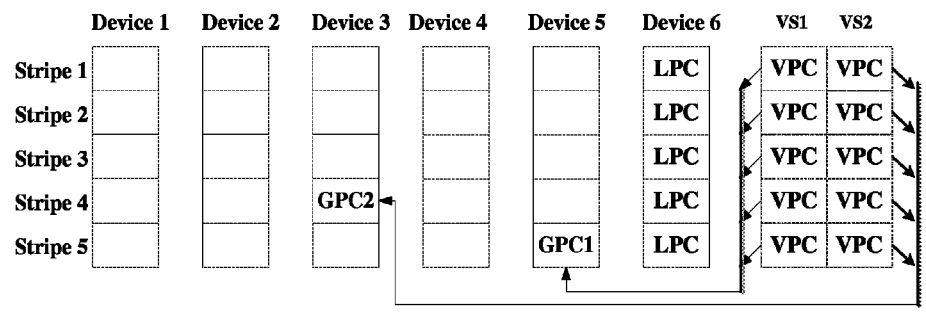

The above process will be described below in conjunction with specific examples. FIGS. 6A, 6B, respectively, illustrate schematic diagrams of storage arrays corresponding to FIGS. 4A and 4B. In the example of FIG. 6A, as in FIG. 4A, F=L=1. Therefore, 2-fault tolerant erasure coding is performed on the data chunks in each stripe in FIG. 6A, thereby generating two groups of redundancy parity data. Any one of the groups of redundancy data is stored in the selected local parity chunk LPC in FIG. 4A. In addition to the selected local parity chunk LPC, FIG. 6A also shows in dashed lines one virtual parity chunk VPC for each stripe. It may be considered that the m virtual parity chunks constitute a virtual parity storage VS. In the above step 241, for each stripe, the group of parity data in the generated two groups of redundancy parity data that is not stored in the LPC is stored in the virtual parity chunk VPC. Next, in step 242, operation is performed on the data in VPCs corresponding to all different stripes, that is, all the parity data stored in the virtual parity storage VS, thereby obtaining one group of global parity data. This group of global parity data may be stored in the selected global parity chunk GPC.

A storage array in FIG. 6B corresponds to that shown in FIG. 4B. Thus, in FIG. 6B, F=1 and L=2. Therefore, it is possible to perform erasure coding with fault tolerance of 3 on data chunks in each stripe of FIG. 6B, thereby generating three groups of redundancy parity data. One of the groups of redundant data is stored in the selected local parity chunk LPC in FIG. 4B. In addition, in FIG. 6B, L=2 virtual parity storages VS1 and VS2 may be further provided. VS1 and VS2 are also striped. Thus, each stripe further correspondingly "has" two virtual parity chunks. Based on this, in step 241, for each stripe, another two groups of parity data which are not stored in the LPC are respectively stored in two virtual parity chunks VPC to which this stripe corresponds. Next, in step 242, for each virtual parity storage VS, operation is performed on all parity data stored therein to obtain global parity data. Then in step 243, the global parity data obtained through operation is stored in the global parity chunks respectively. Specifically, global parity data D1 may be obtained by performing operation on the data in the virtual parity chunks in VS1, and global parity data D2 may be obtained by performing operation on the data in the virtual parity chunks in VS2. Next, D1 may be stored in GPC1, and D2 may be stored in GPC2.

For the case of other F and L values, those skilled in the art may appropriately execute steps 23-24 with reference to the above specific examples, thereby storing redundancy parity data generated by fault tolerant erasure coding using the local parity chunks and the global parity chunks. With such redundancy parity data, when there are device failures and/or latent errors in the storage array, the erroneous data chunks may be recovered.

Figure 7:
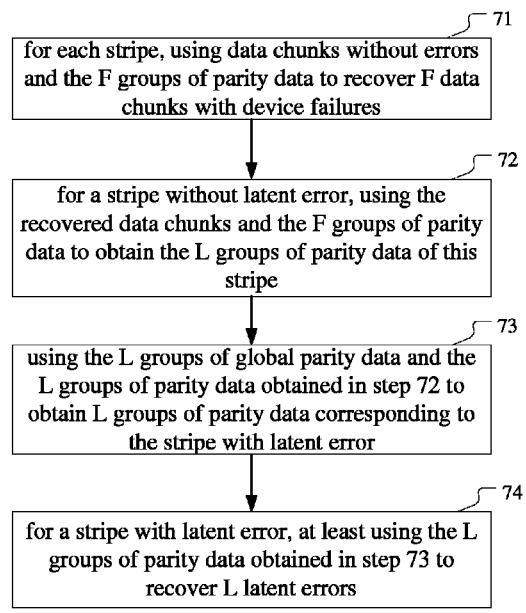
FIG. 7 shows steps of recovering erroneous data chunks.

According to one embodiment of the present invention, based on the above stored redundancy parity data, the method of managing the storage array further comprises a step of using these parity data to recover erroneous data chunks. FIG. 7 illustrates a flowchart of this process. As shown in FIG. 7, first, in step 71, for each stripe, data chunks without errors and F groups of parity data stored in the F local parity chunks are used to recover F data chunks with errors due to device failures. Next, in step 72, for each stripe without latent error, the recovered data chunks and the F groups of parity data are used to obtain the L groups of parity data of this stripe. In step 73, L groups of global parity data stored in the L global parity chunks and the L groups of parity data obtained in step 72 are used to obtain L groups of parity data to which the stripe with latent error corresponds. Finally, in step 74, for a stripe with latent error, at least the L groups of parity data obtained in step 73 are used to recover L latent errors. It can be understood that the above flow is for case where there are F device failures and L latent errors present simultaneously in the storage array. If there are only device failures in the storage array, it is then only required to perform step 71. If there are only latent failures in the storage array, it is then only required to perform steps 72-74. The execution of the above steps is described below in conjunction with a specific example.

Figure 8:
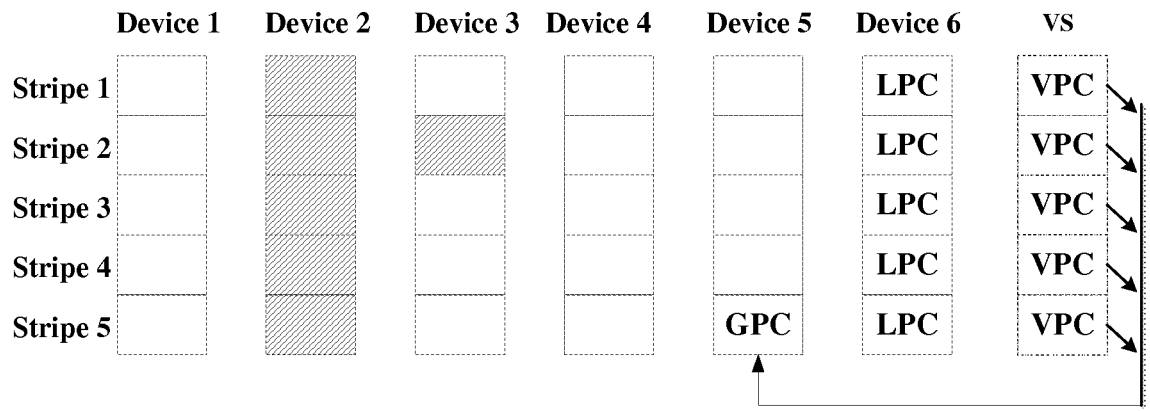
FIG. 8 shows a schematic diagram of errors in the storage arrays corresponding to FIG. 6A.

FIG. 8 shows a schematic diagram of errors in the storage arrays corresponding to FIG. 6A. As described above, the storage array can simultaneously tolerate one device failure and one latent error. Assumed the storage device 2 fails, accordingly, all data chunks therein, namely, the entire second column in the storage array, have errors. In addition, the storage chunk of the second stripe in the storage device 3 also fails. The erroneous data chunks are shown by shaded blocks. In the case where the storage array of FIG. 8 has stored redundancy parity data in the local parity chunks and the global parity chunk, respectively, in accordance with the method shown in FIG. 2, these parity data may be used to recover the erroneous data chunks.

Specifically, in step 71, based on the error correction mechanism of erasure code, since the position of the device failure is known, normal data chunks and one local parity chunk in each stripe may be used to recover one erroneous data chunk. Thus, data chunks in the storage device 2 with errors occurring, namely, the entire second column in the array may be recovered. Thus, for stripes without a latent error, namely, stripes except stripe 2, since the erroneous data chunks caused by device failures have been recovered, the entire stripe has no erroneous data chunks. For each of such stripes, in step 72, two groups of redundancy parity data may be obtained again by re-calculating the erasure codes based on all the data chunks. As mentioned earlier, one of these two groups of parity data has been stored in the local parity chunk. Accordingly, by comparing the obtained two groups of parity data with data in the local parity chunk, the parity data stored in the virtual parity chunk can be determined. Thus, data in virtual parity chunks to which stripes 1 and 3-5 correspond can be obtained. Next, in step 73, since the operation manner of the global parity data is known, it is possible to use the global parity data stored in the global parity chunk and data in the known virtual parity chunks (i.e., data in virtual parity chunks corresponding to stripes 1 and 3-5) to deduct reversely data stored in unknown virtual parity chunks (i.e., virtual parity chunk corresponding to the stripe 2 with latent errors). At this point, for the stripe 2, the entire two groups of redundancy parity data are obtained. Then, in step 74, it is possible to use the two groups of redundant parity data, namely, the parity data in the local parity chunk and the parity data in the virtual parity chunk obtained in step 73, to recover the data chunk with errors. Through the above processes, erroneous data chunks caused by one device failure and one latent error may be recovered.

For the case of the presence of a plurality of device failures, i.e., F>1, F local parity chunks may be used in step 71 to recover simultaneously F erroneous data chunks occurring due to device failures. For the case of the presence of a plurality of latent errors, i.e., L>1, there are L unknown virtual parity chunks in step 73 and also L global parity chunks. When operation manner of global parity chunks is known, data in the L unknown virtual parity chunks may be deducted from the L global parity chunks and known virtual parity chunks. Further, L latent erroneous data chunks are recovered using the obtained L virtual parity chunks and other data chunks. For the above processes, those skilled in the art can appropriately perform the above steps 71-74 with respect to the case of other F and L values by reading the above examples and specific description, thereby recovering erroneous data chunks occurring due to device failures and latent errors.

In one embodiment, according to the size of the storage device, a large storage array may be further divided into a number of logical groups, each logical group including a fixed number of stripes. The above step of selecting the local parity chunk and global parity chunk, the step of generating and storing redundant parity data, and the step of recovering erroneous data chunks according to redundancy parity data may be performed with respect to one or more logical groups (not necessarily with respect to the entire storage array). This makes the setting and error correction of the storage array more flexible. However, for purpose of simplicity, the description is merely directed to the storage array. It should be understood, however, that during the operation and processing associated with the global parity chunks, the global parity chunks may also be directed to a certain logical group, not necessarily to the entire storage array.

To sum up, the method of the embodiment of the present invention sets the storage array in an initialization stage of the storage array, comprising striping the storage array, and selecting from it the local parity chunks and global parity chunks. In a data storage stage, according to the previous setting, redundancy parity data generated by erasure coding on the data chunks may be stored in the local parity chunks and the global parity chunks respectively. Thus, when device failures and latent errors occur in the storage array, erroneous data chunks may be recovered according to the redundancy parity data stored in the local parity chunks and global parity chunks. Through a way of combining the local parity chunks and the global parity chunks, any number of device failures and latent errors can be recovered with less storage space of the storage array occupied for storing the redundancy parity, thereby improving the space usage efficiency and fault tolerance of the storage array.

As described above, there is also another type of error in the storage array, i.e., silent error. Generally, the storage device itself cannot detect this error and cannot determine the position of error. To this end, the management method of the embodiment of the invention further detects and recovers silent errors in the storage array in a way of appending checksums.

Figure 9:
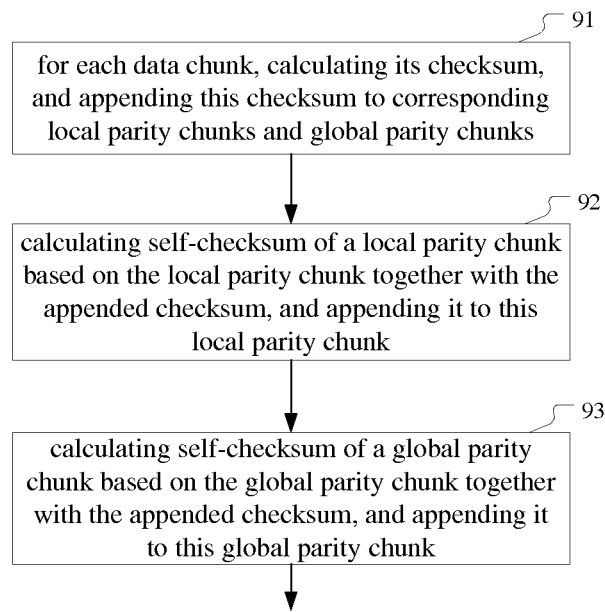
FIG. 9 shows steps of appending checksums to a storage array.

In one embodiment, the management method of the present invention further comprises a process of appending checksum for the storage array. FIG. 9 illustrates a flowchart of this process. As shown in FIG. 9, in step 91, for each data chunk in the storage array, the checksum of this data chunk is calculated, and is appended to the corresponding local parity chunks and global parity chunks. Next, in step 92, for each local parity chunk, self-checksum is calculated based on the local parity chunk itself together with the appended checksum of data chunks, and this self-checksum is appended to this local parity chunk; in step 93, for each global parity chunk, self-checksum is calculated based on the global parity chunk itself together with the appended checksum of data chunks, and this self-checksum is appended to this global parity chunk. The execution of the step is described below in conjunction with a specific example.

FIG. 10 shows a schematic diagram of appended checksums according to one embodiment. D0-D4 in FIG. 10 represent data chunks, and P1 and P2 represent local parity chunks. All storage chunks D0-P2 may constitute one stripe of a storage array, for example, any stripe of the storage array shown in FIG. 4C. In step 91, the checksum CKi is calculated for each data chunk Di, and is appended to the corresponding local parity chunks and global parity chunks. For a data chunk, its corresponding local parity chunks are local parity chunks in the same stripe. Thus, each local parity chunk is appended with checksums of all data chunks in the same stripe. As shown in FIG. 10, both P1 and P2 are attached with checksums CK0-CK4 from the data chunks D0-D4. Next, in step 92, based on the local parity chunk Pi itself together with the appended checksums CK0-CK4, self-checksum CK-Pi is calculated. Here, in the calculation of self-checksum, the appended checksums of data chunks have been taken into consideration. Although a global parity chunk is not shown, it may be appreciated that the global parity chunk is based on comprehensive processing of all stripes in the storage array (or logical groups), and all the data chunks in the storage array (or logical groups) will append their checksums to the global parity chunk. In the example of FIG. 6A, a global parity chunk will be appended with checksums of twenty four data chunks. Accordingly, in step 93, for each global parity chunk, self-checksum is calculated based on the global parity chunk itself together with all the appended checksums, and is appended to the global parity chunk. Although this will lead to a large amount of checksums stored in the global parity chunk, due to the very small number of bytes of the checksum, the storage of these checksums does not occupy large storage space.

More importantly, such storage manner is very advantageous for the detection of silent errors in the storage array. In one embodiment, when the above checksum is appended, it is added as a suffix to the end of the data, and stored together in the data chunks.

According to one embodiment, the management method of the present invention further comprises a process of detecting silent errors. As mentioned earlier, silent errors mainly include data corruption and data staling. When the data chunk Di has data corruption, such error may be detected by checking the checksum CKi to which Di corresponds. The check of stale data can be implemented by cross-checking between different storage chunks.

Figure 11:
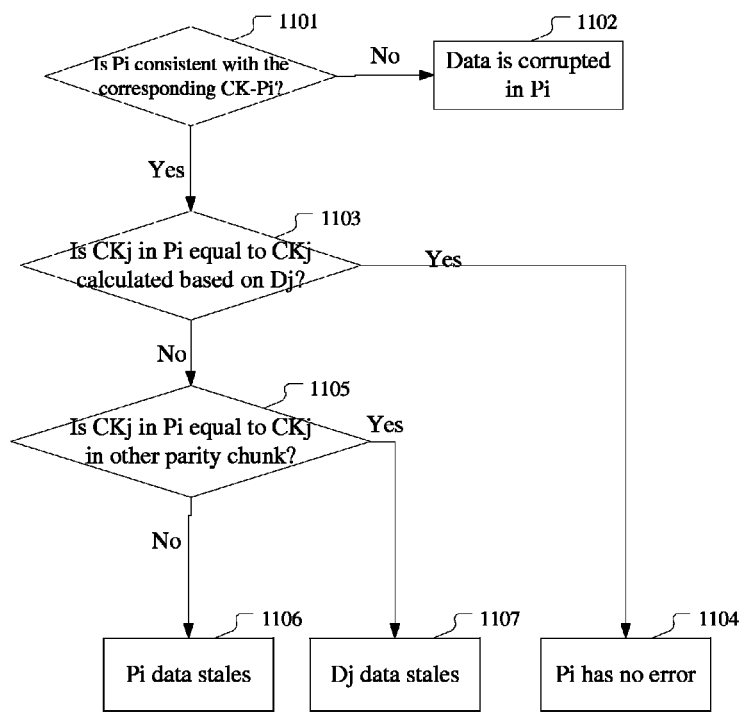
FIG. 11 shows a flowchart of detecting silent errors according to one embodiment.

FIG. 11 shows a flowchart of detecting silent errors according to one embodiment. As shown in FIG. 11, first, in step 1101, the consistency of a parity chunk Pi with the corresponding self-checksum CK-Pi is checked. Here, the parity chunk Pi may be any local parity chunk or global parity chunk. If they are inconsistent, then in step 1102, it is determined that Pi has data corruption. At this point, an error label may be appended to Pi. If they are consistent, then the flow proceeds to step 1103 of comparing checksum CKj appended to Pi corresponding to the data chunk Dj with checksum CKj calculated based on the data chunk Dj. Assumed that data in the data chunk Dj is updated, accordingly, the checksum CKj appended to Pi will also be updated. Therefore, if the checksum CKj appended to Pi is consistent with the CKj calculated based on the data chunk Dj, then in step 1104, it can be determined that the parity chunk Pi has no error. If they are not consistent, then it is possible that data of Dj itself stales and fails to be updated successfully but the CKj appended to Pi has been updated already. There is another possibility that Pi has an error of stale data and fails to be updated, and therefore the CKj appended thereto is stale data and is inconsistent with the CKj calculated according to the updated data chunk Dj. Therefore, it is also required to further make judgment with respect to Pi. Specifically, in step 1105, the CKj appended to Pi is compared to CKj in other parity chunks. Since there are at least two parity chunks (one local parity chunk and one global parity chunk at least) in the storage array, then the parity chunk Pi may be compared with any other parity chunk in terms of CKj. If the comparison result is that the CKj in the parity chunk Pi is different from CKj in other parity chunk, then in step 1106, it can be determined that Pi has stale data. If the comparison result is that the CKj in the parity chunk Pi is the same as CKj in other parity chunk, that is, the CKj calculated based on the data chunk Dj is different from CKjs in the two parity chunks, it can be determined in step 1107 that the data chunk Dj has stale data.

With the above method, silent errors in the data chunks and parity chunks may be detected effectively. Where silent errors are detected, the remaining data chunks and parity chunks without error labels may be utilized to recover erroneous storage chunks.

To sum up, by executing the method of the embodiment of the present invention with respect to the storage array, a variety of errors in the storage array may be detected and recovered effectively.

Figure 12:
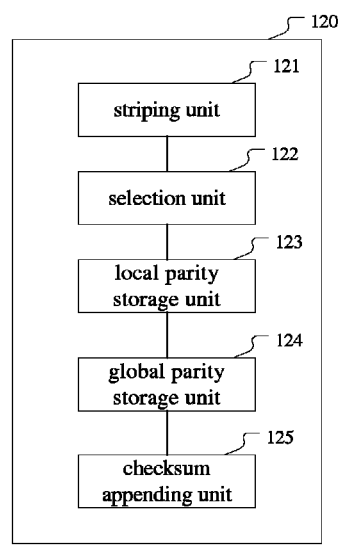
FIG. 12 shows a schematic block diagram of an apparatus of managing a storage array according to one embodiment of the present invention.

Based on the same inventive idea, the present invention further provides an apparatus of managing the storage array. FIG. 12 shows a schematic block diagram of an apparatus of managing a storage array according to one embodiment. As shown, the apparatus for managing the storage array is generally denoted by 120. According to one embodiment, the apparatus 120 includes: a striping unit 121 configured to stripe a storage array consisting of n storage devices to form m stripes, wherein each stripe includes n storage chunks, and the n storage chunks are from the n storage devices; a selection unit 122 configured to select F storage chunks from each stripe as local parity chunks, to select another L storage chunks from the storage array as global parity chunks, and to use at least a part of storage chunks in the storage array except the local parity chunks and global parity chunks as data chunks; a local parity storage unit 123 configured to perform (F+L) fault tolerant erasure coding on data in all data chunks in a stripe to generate (F+L) groups of parity data, and store F groups of parity data therein in the F local parity chunks in this stripe, respectively; and a global parity storage unit 124 configured to perform cross-stripe operation on L groups of parity data of the (F+L) groups of parity data to generate L groups of global parity data, and store the L groups of global parity data in the L global parity chunks, respectively.

In one embodiment, the apparatus 120 further includes an error recovering unit configured to execute the flow as shown in FIG. 7.

In one embodiment, the apparatus 120 further includes a checksum appending unit 125 for appending a checksum to storage chunks in the storage array. Specifically, the checksum appending unit 125 includes a first appending module configured to calculate, for a data chunk in the storage array, a checksum of the data chunk, and append the checksum to the corresponding local parity chunk and global parity chunk; a second appending module configured to calculate a self-checksum of a local parity chunk based on the local parity chunk itself together with the appended checksum of data chunk, and append the self-checksum to the local parity chunk; and a third appending module configured to calculate a self-checksum of a global parity chunk based on the global parity chunk itself together with the appended checksum, and append the self-checksum of the global parity chunk to the global parity chunk.

In one embodiment, the apparatus 120 further includes a detecting unit, configured to detect silent errors in the storage array. Specifically, the detecting unit may execute the step flow shown in FIG. 11.

For detailed execution manner of the above units, reference may be made to the detailed description of process steps in conjunction with specific examples, which will be omitted here for brevity.

In one embodiment, the apparatus 120 in whole or in part may be integrated into the existing storage array controller, as enhancement of its functions. In another embodiment, the apparatus 120 can be used as a separate apparatus to communicate with the existing storage array controller and assist the controller in control and management of the storage array.

With the above-described method and apparatus, a variety of errors in the storage array can be detected and/or recovered, improving fault tolerance and space utilization of the storage array.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of managing a storage array consisting of a number (n) storage devices, the method comprising:
   striping the storage array to form a number (m) stripes, wherein each stripe contains the number (n) storage chunks from the number (n) storage devices respectively, and the storage array comprises a number (n*M) storage chunks;
   selecting a number (F) storage chunks from each stripe as local parity chunks, selecting a number (L) storage chunks from the storage array as global parity chunks, and using at least one of the storage chunks in the storage array except the local parity chunks and the global parity chunks as data chunks, wherein at least one of the storage devices in the storage array comprises one or more data chunks and one or more global parity chunks;
   performing a number (F+L) fault tolerant erasure coding on data in all the data chunks in one of the number (m) stripes to generate the number (F+L) groups of parity data, and storing only the number (F) groups of parity data therein respectively into the number (F) local parity chunks of the one of the number (m) stripes; and
   performing a cross-stripe operation on the number (L) groups of parity data of the number (F+L) groups of parity data to generate the number (L) groups of global parity data, and storing the number (L) groups of global parity data respectively into the number (L) global parity chunks,
   wherein the number (F) is less than the number (n).

2. The method according to claim 1, wherein selecting the number (F) storage chunks from each stripe as local parity chunks comprises:
   selecting the number (F) storage devices from the number (n) storage devices as parity storages and using storage chunks in the number (F) parity storages as local parity chunks.

3. The method according to claim 1, wherein performing the cross-stripe operation comprises:
   for each stripe, storing the number (L) groups of parity data in the number (L) virtual parity chunks respectively; and
   performing an operation on the parity data in the virtual parity chunks corresponding to all different stripes to generate the number (L) groups of global parity data.

4. The method according to claim 3, further comprising:
   setting the number (L) virtual parity storages which are striped, and using storage chunks in each virtual parity storage as the virtual parity chunks.

5. The method according to claim 1, wherein performing the cross-stripe operation comprises one of or a combination of several of: XOR operation, summation operation and linear operation.

6. The method according to claim 1, further comprising:
   for each stripe, using data chunks without error and the number (F) groups of parity data stored in the number (F) local parity chunks to recover the number (F) erroneous data chunks due to device failures.

7. The method according to claim 6, further comprising:
   using the recovered data chunks and the number (F) groups of parity data to obtain the number (L) groups of parity data for a stripe without a latent error;
   using the number (L) groups of global parity data stored in the number (L) global parity chunks and the obtained number (L) groups of parity data for the stripe without the latent error to obtain the number (L) groups of parity data corresponding to a stripe with a latent error; and
   using at least the number (L) groups of parity data corresponding to the stripe with the latent error to recover the number (L) latent errors.

8. The method according to claim 1, further comprising:
   calculating a checksum of a data chunk in the storage array, and appending the checksum to corresponding local parity chunks and global parity chunks;
   calculating a self-checksum of a local parity chunk based on the local parity chunk together with the appended checksum of data chunks, and appending the self-checksum to the local parity chunk; and
   calculating a self-checksum of a global parity chunk based on the global parity chunk together with the appended checksum of data chunks, and appending the self-checksum to the global parity chunk.

9. The method as claimed in claim 8, further comprising:
   detecting data corruption in a particular parity chunk Pi by checking self-checksum CK-Pi of the parity chunk Pi, the parity chunk Pi being any local parity chunk or global parity chunk.

10. The method according to claim 9, further comprising:
    comparing a checksum CKj appended in the parity chunk Pi corresponding to a data chunk Dj with the checksum CKj calculated based on the data chunk Dj and the checksum CKj appended in other parity chunks, thereby detecting stale data in the parity chunk Pi.

11. An apparatus of managing a storage array consisting of a number (n) storage devices, the apparatus comprising:
    a striping unit configured to stripe the storage array to form a number (m) stripes, wherein each stripe contains the number (n) storage chunks from the number (n) storage devices respectively, and the storage array comprises a number (n*M) storage chunks;
    a selection unit configured to select a number (F) storage chunks from each stripe as local parity chunks, select a number (L) storage chunks from the storage array as global parity chunks, and use at least one of the storage chunks in the storage array except the local parity chunks and the global parity chunks as data chunks, wherein at least one of the storage devices in the storage array comprises one or more data chunks and one or more global parity chunks;
    a local parity storage unit configured to perform a number (F+L) fault tolerant erasure coding on data in all the data chunks in one of the number (m) stripes to generate the number (F+L) groups of parity data, and store only the number (F) groups of parity data therein respectively into number (F) local parity chunks in the one of the number (m) stripes; and
    a global parity storage unit configured to perform a cross-stripe operation on the number (L) groups of parity data of the number (F+L) groups of parity data to generate the number (L) groups of global parity data, and store the number (L) groups of global parity data respectively into the number (L) global parity chunks, wherein the number (F) is less than the number (n).

12. The apparatus according to claim 11, wherein the selection unit is configured to select the number (F) storage devices from the number (n) storage device as parity storages, and use storage chunks in the number (F) parity storages as local parity chunks.

13. The apparatus according to claim 11, wherein the global parity storage unit is configured to:

for each stripe, store the number (L) groups of parity data in the number (L) virtual parity chunks respectively; and perform an operation on the parity data in the virtual parity chunks corresponding to all different stripes to generate the number (L) groups of global parity data.

14. The apparatus according to claim 13, wherein the selection unit is further configured to set the number (L) virtual parity storages which are striped, and use storage chunks in each virtual parity storage as the virtual parity chunks.

15. The apparatus according to claim 11, wherein the cross-stripe operation comprises one of or a combination of several of: XOR operation, summation operation and linear operation.

16. The apparatus according to claim 11, further comprising:

an error recovering unit configured to: for each stripe, use data chunks without error and the number (F) groups of parity data stored in the number (F) local parity chunks to recover the number (F) erroneous data chunks due to device failures.

17. The apparatus according to claim 16, wherein the error recovering unit is further configured to:

use the recovered data chunks and the number (F) groups of parity data to obtain the number (L) groups of parity data for a stripe without a latent error;

use the number (L) groups of global parity data stored in the number (L) global parity chunks and the obtained the number (L) groups of parity data for the stripe without the latent error to obtain the number (L) groups of parity data corresponding to a stripe with a latent error; and use at least the number (L) groups of parity data corresponding to the stripe with the latent error to recover the number (L) latent errors.

18. The apparatus according to claim 11, further comprising:

a checksum appending unit comprising a first appending module configured to calculate a checksum of a data chunk in the storage array, and append this checksum to corresponding local parity chunks and global parity chunks;

a second appending module configured to calculate a self-checksum of a local parity chunk based on the local parity chunk together with the appended checksum of data chunks, and append the self-checksum to the local parity chunk; and a third appending module configured to calculate a self-checksum of a global parity chunk based on the global parity chunk together with the appended checksum data chunks, and append the self-checksum to the global parity chunk.

19. The apparatus according to claim 18, further comprising:

a detection unit configured to detect data corruption in a particular parity chunk Pi by checking self-checksum CK-Pi of the parity chunk Pi, the parity chunk Pi being any local parity chunk or global parity chunk.

20. The apparatus according to claim 19, the detection unit is further configured to compare checksum CKj appended in the parity chunk Pi corresponding to the data chunk Dj with checksum CKj calculated based on the data chunk Dj and checksum CKj appended in other parity chunks, thereby detecting stale data in the parity chunk Pi.

\* \* \* \* \*

UNITED STATES PATENT AND TRADEMARK OFFICE
CERTIFICATE OF CORRECTION

PATENT NO. : 9,229,810 B2
APPLICATION NO. : 13/919295
DATED : January 5, 2016
INVENTOR(S) : Huan He et al.

It is certified that error appears in the above-identified patent and that said Letters Patent is hereby corrected as shown below:

In the Claims

Column 15
Lines 21-22, "contains the number (n) storage chunks" should read -- contains storage chunks --
Line 23, "(n*M)" should read -- (n*m) --

Column 16
Lines 44-45, "contains the number (n) storage chunks" should read -- contains storage chunks --
Line 47, "(n*M)" should read -- (n*m) --

Signed and Sealed this
Twelfth Day of July, 2016

Michelle K. Lee
*Director of the United States Patent and Trademark Office*